United States Patent [19]

Kurtz et al.

[11] Patent Number: 4,597,519

[45] Date of Patent: Jul. 1, 1986

[54] LEAD WIRE BONDING WITH INCREASED BONDING SURFACE AREA

[75] Inventors: John A. Kurtz; Donald E. Cousens, both of Saco; Mark D. Dufour, Portland, all of Me.

[73] Assignee: Fairchild Camera & Instrument Corporation, Cupertino, Calif.

[21] Appl. No.: 584,083

[22] Filed: Feb. 27, 1984

[51] Int. Cl.⁴ .................... B23K 1/06; B23K 31/02
[52] U.S. Cl. .................... 228/102; 228/110; 228/179; 228/8; 228/18; 219/56.21; 219/56.22
[58] Field of Search .......... 228/102, 110, 18, 1.1, 228/4.5, 7, 8, 179, 103; 219/56.21, 56.22

[56] References Cited

U.S. PATENT DOCUMENTS

| | | | |
|---|---|---|---|
| 3,643,321 | 2/1972 | Field et al. | 228/110 |
| 4,098,447 | 7/1978 | Edson et al. | 228/110 |
| 4,323,759 | 4/1982 | Edson et al. | 228/110 |
| 4,390,771 | 6/1983 | Kurtz et al. | 228/110 |
| 4,438,880 | 3/1984 | Smith et al. | 228/110 |

Primary Examiner—Nicholas P. Godici
Assistant Examiner—Samuel M. Heinrich
Attorney, Agent, or Firm—Kenneth Olsen; Carl L. Silverman; Daniel H. Kane, Jr.

[57] ABSTRACT

An improved lead wire ball bonding machine for bonding wire leads between an integrated circuit chip and the lead frame on which the chip is mounted is provided with a bonding tool position sensor coupled to receive the Z-motion velocity waveform signal to the servo motor which drives the bonding head and bonding tool. This sensor detects the signal level and direction of change or polarity of the Z-motion velocity waveform signal for determining the location of the bonding head and bonding tool. The bonding tool position sensor is coupled and adjusted for generating a first output signal corresponding to a first location of the bonding head and bonding tool during motion downward to the die pad of an integrated circuit chip prior to contact by the bonding tool and lead wire for ball bonding. The position sensor also provides a second output signal corresponding to a second location of the bonding head and bonding tool during motion downward toward a lead frame finger prior to contact of the bonding tool and lead wire for wedge bonding. The first and second output signals from the sensor are coupled to the ultrasonic generator of the bonding machine for application of ultrasonic bonding energy to the bonding tool prior to contact thereby increasing the bonding surface area between the lead wire and substrate. According to an alternative embodiment, an electrical sensor is provided for electrically sensing initial contact of the bonding tool and lead wire with the die pad or lead frame finger for actuating the ultrasonic generator and applying ultrasonic bonding energy to the bonding tool substantially upon initial contact with minimal delay thereby also optimizing the bonding surface area of the ball bond and wedge bond. Both the apparatus and method for lead wire bonding with increased bonding surface area are described.

15 Claims, 16 Drawing Figures

FIG. 1

(PRIOR ART)

FIG. 2

(PRIOR ART)

LEAD WIRE BONDING WITH INCREASED BONDING SURFACE AREA

CROSS REFERENCE TO RELATED APPLICATION

This invention is related to U.S. Pat. No. 4,555,052, entitled LEAD WIRE BOND ATTEMPT DETECTION, issued Nov. 26, 1985 and to U.S. patent application Ser. No. 584,084 entitled VARIATION AND CONTROL OF BOND FORCE, filed concurrently with the present patent application on Feb. 27, 1984. The related applications were filed by the present applicants, were assigned to the assignee of the present invention, and the contents thereof are incorporated herein by reference.

TECHNICAL FIELD

This invention relates to a new lead wire bonding machine for bonding fine lead wires between an integrated circuit chip and the lead frame on which the chip is mounted for coupling to external circuitry. The invention provides a new method for ball bonding the end of lead wire held in the capillary bonding tool of the ball bonding machine to a die pad of an integrated circuit chip and for wedge bonding a segment of the lead wire spaced from the ball bond to a lead frame finger. The invention provides increased welding or bonding surface area for more secure bonds during successive ball bond wedge bond cycles.

BACKGROUND ART

The bonding or welding of lead wires between an integrated circuit chip or die and the lead frame on which the die is mounted for coupling to external circuitry is presently accomplished by manual, semiautomatic and automatic lead wire bonding machines. A fine lead wire such as 1 mil diameter gold bonding wire is held in a capillary bonding tool so that the lead wire projects beyond the end of the tool. The bonding tool is mounted in a tool holder arm which is in turn a component of the movable bonding head of the bonding machine. The bonding tool is appropriately mounted over a strip of lead frames retained within the guides of the bonding machine work holder. At a finer level, the bonding tool is positioned over the metalized die pad of an integrated circuit chip mounted on one of the lead frames, and then over a lead frame finger.

Examples of such lead wire bonding machines include the Model 478, High Speed Tailless Thermocompression Ball Bonder, a manual or semi-automatic model manufactured by Kulicke & Soffa Industries, Inc. (K&S), Horsham, Penn. 19044, described in U.S. Pat. No. 3,643,321; the K&S Model 1418/1419, Automatic High Speed Wire Bonder With Digital Bonding Head; and K&S Model 1482, Automatic Wire Bonder. Other examples of state of the art lead wire bonding machines are those of The Welding Institute, Abington, England, described in U.S. Pat. Nos. 4,323,759 and 4,098,447.

Bonding of lead wire between the die pad of an integrated circuit chip and a lead frame finger is generally accomplished by a ball bond wedge bond cycle. A spherical ball is formed at the end of the lead wire extending below the capillary bonding tool by, for example, arc discharge between the bonding wire and a shield or shroud electrode. After solidification, the metal ball at the end of the lead wire is brought into intimate contact with the metalized die pad and a bond is formed typically by application of ultrasonic bonding energy to the bonding tool. Thermocompression is also utilized during bonding by maintaining the work holder at an elevated temperature and by applying a specified bonding force to the bonding tool.

The capillary bonding tool is then raised to a level above the ball bond and die with the lead wire feeding through the capillary passageway in the bonding tool. The bonding tool and lead frame are then moved relative to each other for bonding of a segment of the lead wire spaced from the ball bond at another location on a lead frame finger. At this new location the lead wire is brought into intimate contact with the surface of a lead frame finger to form a so-called "wedge bond" or "weld". The wedge bond is formed by the side tip of the bonding tool bearing down on the lead wire against the surface of the lead frame finger. Again, the bond is typically formed by application of ultrasonic bonding energy to the bonding tool. Thermocompression also operates to form the wedge bond. Typically the second bond force applied to the bonding tool for the wedge bond or weld is different from and greater than the first bond force applied to the bonding tool for ball bonding.

In the case of both the ball bond and wedge bond the application of ultrasonic bonding energy to the bonding tool is terminated before further movement of the tool. The joining of the bonded or welded surfaces is therefore completed before the bonding tool is raised. The lead wire is then severed above the wedge bond by clamping the lead wire at a clamp on the bonding head and raising the bonding head, bonding tool and lead wire above the wedge bond so that the lead wire parts at the weakened neck adjacent to the wedge bond. Further background on ball bonding and wedge bonding can be found in the cross referenced U.S. Pat. No. 4,555,052, referred to above, and U.S. Pat. No. 4,390,771.

In performing a ball bond wedge bond cycle, the ball bonding machine typically applies a first bond force to the bonding tool during ball bonding in the order of, for example, approximately 30 to 50 grams according to the size and metal composition of lead wire. During wedge bonding, a second bond force is applied to the bonding tool greater than the first bond force, for example, in the order of approximately 80 to 100 grams or greater according to the diameter of the wire and the composition of the lead wire metal, for pressing, weakening, and partially cutting the lead wire at the end of the wedge bond. The lead wire may then be cleanly severed or parted at the weakened edge by clamping the lead wire in the bonding head and raising the bonding head and bonding tool.

The first and second bonding forces at the bonding tool are typically applied by either the weight of components resting on the bonding tool or tool holder, application of specified spring tension to the bonding tool, tool holder or tool lifter, or the driving force of a drive motor applied to the bonding head or bonding tool supporting components. A disadvantage of presently available ball bonding machines is that the application of ultrasonic bonding energy typically occurs after application of a specified bonding force. Thus, ultrasonic bonding energy is applied to the tool after the lead wire is brought to bear against the die pad or lead frame finger substrate with a force in the order of, for example, 25 grams.

Figure 1:
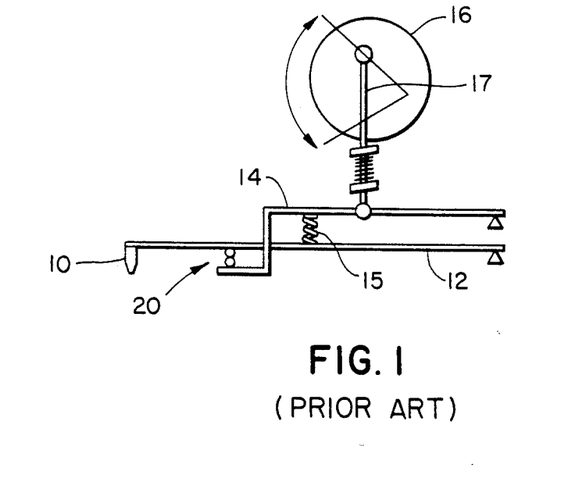
FIG. 1 is diagrammatic view of bonding head elements of a prior art ball bonding machine with the bonding head and bonding tool in raised position and electrical contacts closed.
Figure 2:
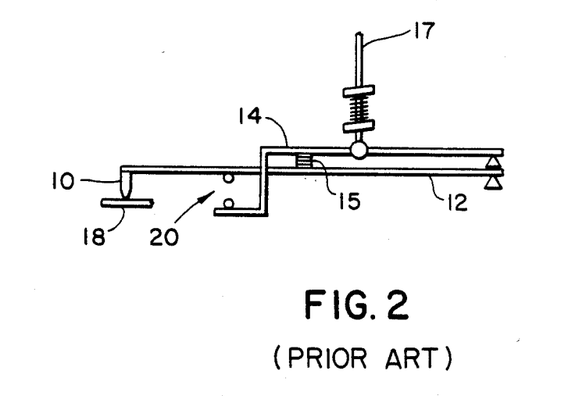
FIG. 2 is diagrammatic view of the same elements of a bonding head as in FIG. 1 with the bonding head and bonding tool in extended or lowered position applying a specified bonding force to the bonding tool in excess of the bonding force level at which the electrical contacts open for initiating application of ultrasonic bonding energy to the bonding tool.

The manner of sensing the threshold level of applied bonding force in the order of, for example, 25 grams is illustrated in the diagrammatic representations of a prior art K&S bonding machine shown in FIGS. 1 and 2. The schematically represented bonding tool 10 is supported in a tool holder or tool holding arm 12 which in turn constitutes part of the movable bonding head of the bonding machine. A tool holder lifter or tool holder lifting arm 14, also part of the bonding head, raises and lowers the tool holder 12 but with some play or relative movement between the tool holder lifter 14 and tool holder 12. During downward movement the tool holder lifter 14 and tool holder 12 are coupled by a spring coupling 15 having a spring constant K selected to impart a desired bonding force to the bonding tool 10. The tool holder lifter 14 is raised and lowered by a servo motor driven crank 16 through an eccentrically mounted connecting rod 17 and related linkages and couplings. The servo motor operating crank 16 and connecting rod 17 are driven by a servo motor and control loop hereafter described with reference to FIG. 5B. During downward motion of the tool holder lifter 14 and tool holder 12 driven by connecting rod 17 for ball bonding or wedge bonding, the bonding tool is applied against the substrate 18, either the die pad of an integrated circuit chip or a lead frame finger with the desired bonding force proportional to the spring constant K and the depth of compression of the spring in turn determined by the stroke of rod 17.

The bonding tool holder 12 rests against the tool holder lifter 14 at electrical contacts 20 which are connected in an electrical circuit not shown which provides an electrical sensor. The electrical contacts 20 are closed during vertically upward motion of the bonding tool, that is during most of the upward stroke of connecting rod 17. Furthermore, the electrical contacts are closed during the downward stroke until the applied compressional force on the bond force spring 15 initiates compression of the spring separating the contacts 20 so that the contacts are open. The elements are typically constructed and arranged so that the contacts 20 open when the applied compressional force or bonding force reaches a level of, for example, in the order of 25 grams.

Upon opening of the contacts the electrical circuit and sensor not shown turns on the ultrasonic generator of the bonding machine and initiates application of ultrasonic bonding energy from the ultrasonic generator to the tool holder and bonding tool 10. As a result the control of ultrasonic power is dependent upon the application of mechanical force and the opening of mechanical contacts.

Figure 3:
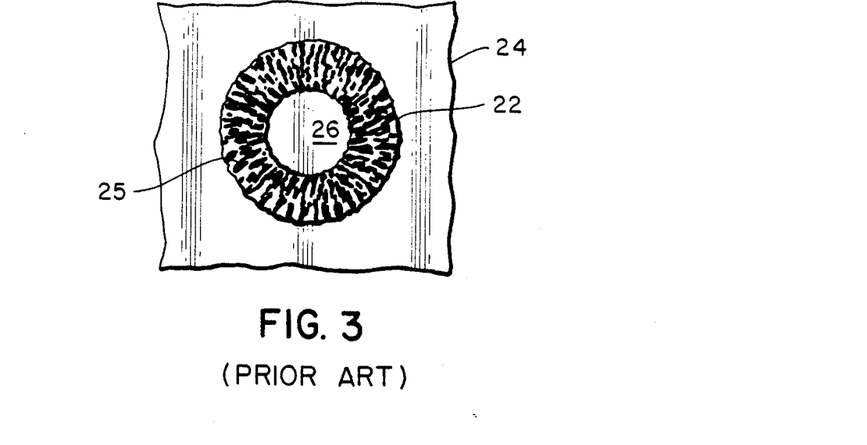
FIG. 3 is a diagrammatic plan view of a prior art ball bonding site on a die pad after pulling away or parting the lead wire bonding ball from the ball bond site.

A disadvantage of the prior art method of mechanical sensing for initiating ultrasonic bonding energy and ultrasonic vibration of the lead wire against the pertinent substrate is that an incomplete or reduced welding or bonding area results. The limited and inferior welding or bonding surface area which results from this method of initiating and controlling ultrasonic bonding energy is illustrated in the diagrammatic plan view of FIG. 3 showing a ball bond site 22 after removal of the compressed bonding ball from the die pad 24 of an integrated circuit chip. The bonding surface area 25 shown in irregular lines is limited to a peripheral band around the circumference of the circular ball bond site. This is because ultrasonic bonding energy arrives at the tool initiating ultrasonic vibration of the compressing surfaces only after contact has been made by the center of the ball at the substrate and after substantial compression of the ball. By that time, the major force bearing region of contact is at the peripheral band enlarging outward as the spherical bonding ball is compressed and flattened against the die pad substrate. Frequently only a minor portion of the available bonding surface actually participates in a co-mingling weld between the two metals of the lead wire and substrate. In effect, the welding surface area or bonding surface area is limited to the area of coincidence of effective thermocompression or bonding force with ultrasonic vibration from application of ultrasonic bonding energy. As a result, a substantial central area 26 in the middle of the ball bonding site remains unwelded.

Figure 4:
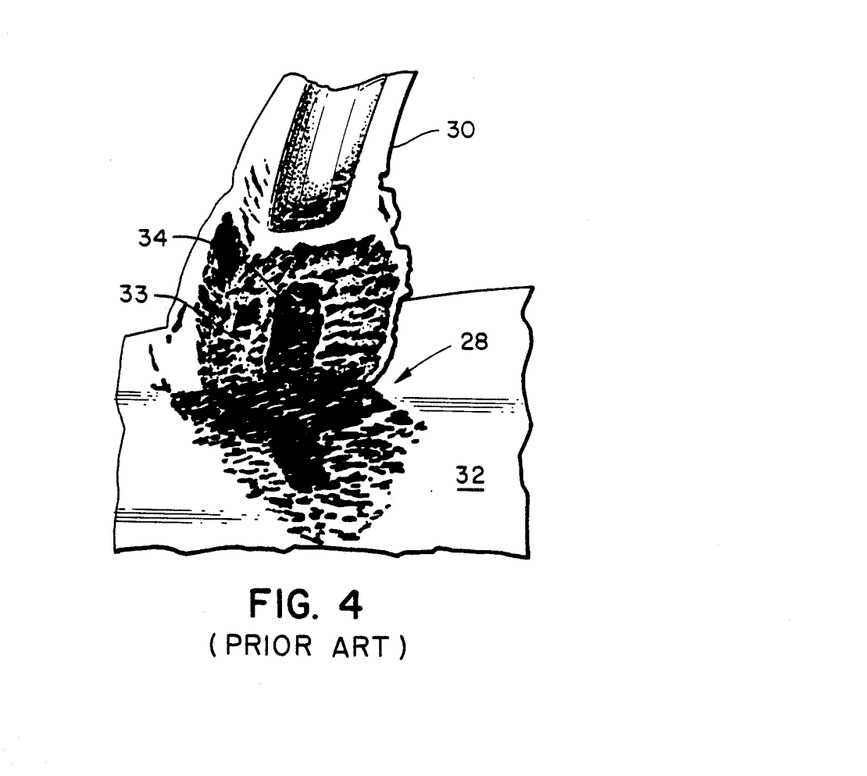
FIG. 4 is a diagrammatic perspective view of a prior art wedge bond site with the lead wire being pulled away or parted from the wedge bond site.

The same limitation on the welding or bonding surface area occurs at the wedge type bond as illustrated in the diagrammatic perspective view of FIG. 4 where a wedge-type bond is being parted by lifting the lead wire 30 from the lead frame finger 32. The effective welding or bonding surface area 33 is limited to a peripheral band of elongate or oval configuration at the periphery of the elongate wedge bond 28. The central portion 34 of the lead wire 30 at the wedge bond site remains unwelded to the substrate.

Because of the failure of welding at the center of both the ball bond and the wedge bond, weldment strength suffers and the maximum pull strength at both bonds is reduced. Applicant's experimental analysis indicates that this sub-optimal bonding and welding prevails because of the substantial delay from the application of first or second bonding forces with compression of the lead wire at the ball bond and wedge bond to the subsequent application of ultrasonic bonding energy. The mechanical methods of sensing bond force for initiation and control further delays the application and onset of ultrasonic bonding energy.

OBJECTS OF THE INVENTION

It is therefore an object of the present invention to provide improved bonding of lead wire between an integrated circuit chip and a lead frame by increasing the welding or bonding surface area of the lead wire at the die pad and at the lead frame finger.

Another object of the invention is to provide a new bonding machine and method in which application of ultrasonic bonding energy and ultrasonic vibration is coincident with contact of the lead wire with a substrate and with application of bonding force thereby increasing the welding and bonding surface area to substantially the entire area of contact between the lead wire and substrate.

A further object of the invention is to provide a ball bonding machine and method with electronic control over initiation and onset of ultrasonic bonding energy prior to contact of the bonding tool and lead wire or at the same time as contact of the bonding tool and lead wire with a substrate die pad or lead frame finger. The invention also contemplates variable control over the timing of turn-on of the ultrasonic generator and onset of ultrasonic bonding energy before contact of the bonding tool and lead wire with a substrate or coincident with contact.

DISCLOSURE OF THE INVENTION

In order to accomplish these results, the invention provides an improved lead wire ball bonding machine of the type having a movable bonding head and capillary bonding tool for ball bonding the end of a lead wire held in the bonding tool to a die pad of an integrated circuit chip and for wedge bonding a segment of the lead wire spaced from the ball bond to a lead frame finger during successive ball bond wedge bond cycles. The invention incorporates a number of prior art elements including an ultrasonic generator for application of ultrasonic bonding energy to the bonding tool, and bond force means such as, for example, weights, springs, or motors for applying specified bonding tool force at the ball bond and then at the wedge bond. The conventional bonding machine components include the logic control or processor which generates digital control signals for initiating and timing the steps in the ball bond wedge bond cycle and the servo motor control loop which generates a Z-motion analog velocity waveform signal for controlling motion of the bonding head and bonding tool throughout the ball bond wedge bond cycle.

In the improved lead wire ball bonding machine the present invention provides a bonding tool position sensor coupled to receive the Z-motion velocity waveform and to detect the signal level and polarity of the Z-motion velocity waveform indicating downward motion of the bonding head and bonding tool. The bonding tool position sensor or Z-motion velocity waveform sensor is coupled and arranged for generating a first output signal corresponding to a first location of the bonding head and bonding tool during motion downward toward the die pad of an integrated circuit chip prior to contact by the bonding tool and lead wire for ball bonding. The position sensor or Z-motion velocity waveform sensor also provides a second output signal corresponding to a second location of the bonding head and bonding tool during motion downward toward a lead frame finger prior to contact of the bonding tool and lead wire for wedge bonding.

The improvement, according to the invention, also provides a coupling element for coupling the first and second output signals from the sensor to the ultrasonic generator of the ball bonding machine for application of ultrasonic energy to the bonding tool prior to contact of the bonding tool and lead wire for ball bonding and wedge bonding respectively. A feature and advantage of this improvement and arrangement according to the invention is that welding of the lead wire to the die pad or lead frame finger substrate is substantially coextensive with the entire surface contact area between the lead wire and substrate. Thermocompression and ultrasonic welding commence upon contact with weld comingling of the two metals throughout the lead wire substrate interface.

In a preferred embodiment of the invention the bonding tool position sensor is an operational amplifier having an input coupled to receive the Z-motion analog velocity waveform signal. The operational amplifier is coupled with a threshold adjustment at the input for adjusting the threshold signal level of the Z-motion waveform signal to be detected. The selected threshold level represents a position of the bonding head and bonding tool during motion in a downward direction toward the die pad of integrated circuit chip or toward a lead frame finger, prior to contact of the bonding tool and lead wire for ball bonding or wedge bonding respectively. The output of the operational amplifier comprises first and second output signals corresponding to the respective first and second locations of the bonding head and bonding tool during motion downward and prior to contact with a substrate or coincident with contact. The selected threshold level for initiating ultrasonic energy prior to or coincident with contact may be varied by varying the threshold adjustment.

The coupling element for coupling the first and second output signals or actuating signals from the operational amplifier to the ultrasonic generator is a gate having an input coupled to the output of the operational amplifier and a second input coupled to receive digital control signals from the logic control circuitry or processor of the bonding machine which indicate start of a ball bond step and a wedge bond step during successive ball bond wedge bond cycles. The output from the gate is coupled to the ultrasonic generator. The gate may be, for example, a flip flop in which the operational amplifier is coupled to the set input of the flip flop, with the reset input of the flip flop coupled to receive digital control signals from the bonding machine logic control or processor. In particular, the flip flop is reset by the falling edge of the ball bond timing signal and wedge bond timing signal originating in the bonding machine microprocessor which turn off the ultrasonic generator upon completion of the ball bond and wedge bond respectively. The output of the flip flop is coupled through a diode to the ultrasonic generator.

According to the improved method of implementing the ball bond wedge bond cycle, the invention contemplates sensing the direction and motion of the bonding tool during the ball bond wedge bond cycle, generating a first output signal corresponding to a first location of the bonding tool during motion of the bonding tool downward toward the die pad of integrated circuit chip prior to contact for ball bonding and applying ultrasonic bonding energy to the bonding tool in response to the first output signal whereby welding or bonding is initiated upon contact for increasing the bonding surface area. The improved method further contemplates generating a second output signal corresponding to a second location of the bonding tool during motion of the bonding tool downward toward a lead frame finger prior to contact for wedge bonding and applying ultrasonic bonding energy to the bonding tool in response to the second output signal also to initiate welding or bonding upon contact.

Application of ultrasonic bonding energy is generally terminated in accordance with the internally programmed timing and control signals of the conventional bonding machine which terminates application of ultrasonic bonding energy at the bonding tool while the bonding tool remains in contact for either ball bonding or wedge bonding. The bonding tool is then raised after the bonding surfaces are joined by welding.

According to an alternative embodiment, the invention contemplates electrically sensing initial contact of the bonding tool and lead wire with the die pad of an integrated circuit chip for ball bonding, generating a bonding energy control signal in response to the electrically sensed initial contact, and applying ultrasonic bonding energy to the bonding tool in response to the bonding energy control signal. By means of electrical sensing and electronic control, ultrasonic bonding energy is applied with minimal delay to the bonding tool substantially upon initial contact for optimizing the bonding surface area of the ball bond. In the preferred embodiment according to this method electrical sensing of initial contact of the bonding tool and lead wire for ball bonding is achieved by coupling the lead wire in a sensing circuit, applying a voltage to the lead wire, and sensing passage of current through the sensing circuit including the lead wire verifying contact of the lead wire with the substrate. Further electrical contact sensing circuits for bonding machines are described in the cross-referenced U.S. Pat. No. 4,555,052.

A feature and advantage of the invention according to either embodiment is that the ultrasonic bonding energy is already applied to the bonding tool upon contact of the lead wire with the substrate or coincident with contact of the lead wire with the substrate so that the full surface area of compressed contact between the lead wire and substrate is joined by weld bonding increasing the pull strength, durability, and life of both the ball bond and weld bond. Other objects, features and advantages of the present invention are apparent in the following specification and accompanying drawings.

BRIEF DESCRIPTION OF THE DRAWINGS

FIG. 12A is a timing diagram for the first embodiment according to the circuit of FIG. 12 while

DESCRIPTION OF PREFERRED EXAMPLE EMBODIMENTS AND BEST MODE OF THE INVENTION

The preferred embodiment of the present invention for lead wire bonding with increased bonding surface area makes use of a number of the prior art components and steps of the conventional ball bonding machine hereafter described with reference to FIGS. 5 thru 10. The prior art elements hereafter described pertain, for example, to the K&S Model 1418/1419 Automatic High Speed Wire Bonder With Digital Bonding Head described in *Kulicke & Soffa Industries, Inc. Technical Training*, 1418/1419 Basic Setup and Adjustments Course Manual (Dec. 17, 1980) and in particular pp. 5–5 thru 5–12.

Figure 5:
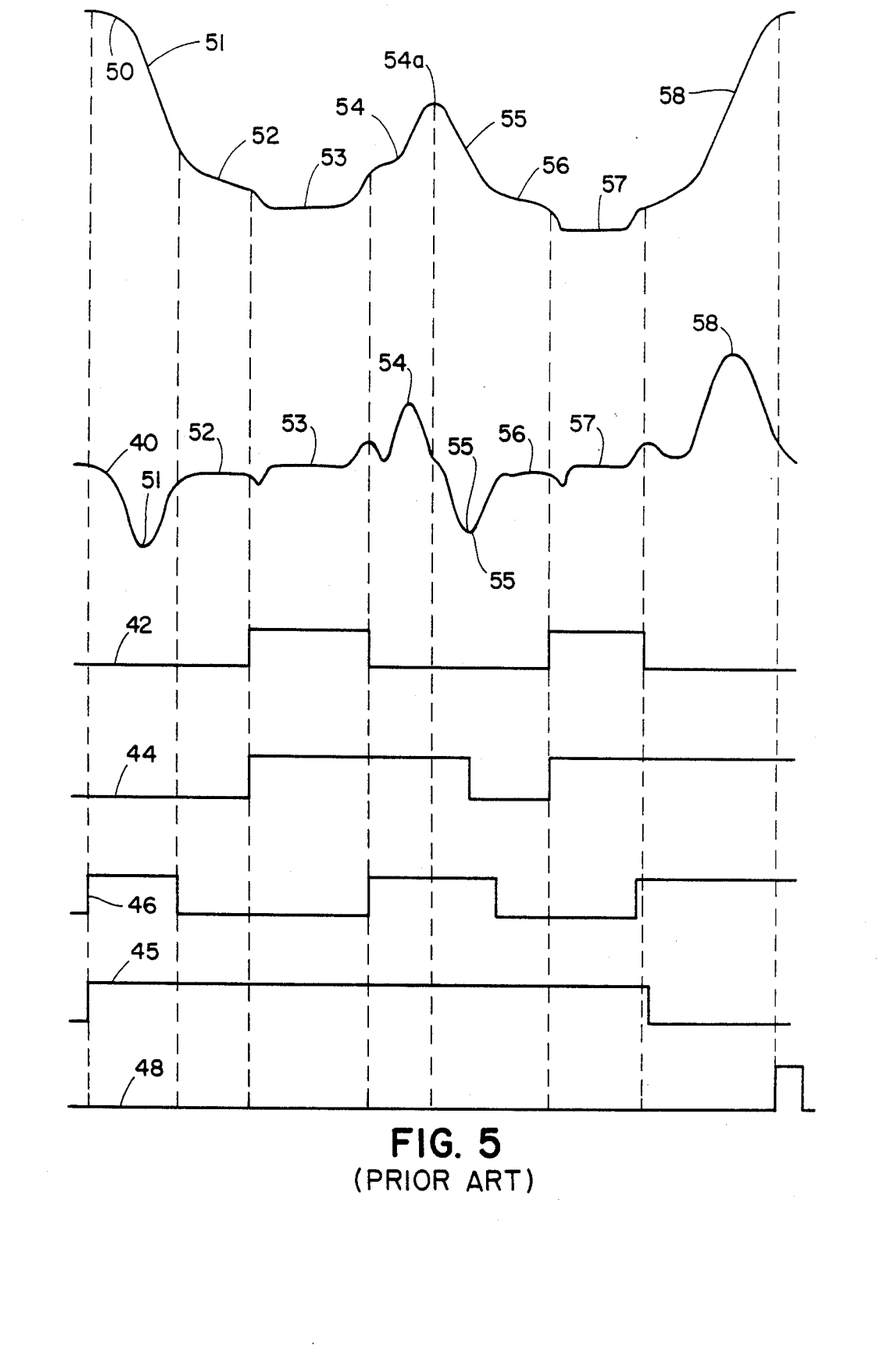
FIG. 5 is a graph of the prior art Z-motion velocity analog waveform signal for controlling the motion velocity of the bonding head and bonding tool; a graph of the corresponding displacement curve showing position or displacement of the bonding tool; and a timing chart for understanding operation of prior art elements of the bonding head and bonding machine in synchronism with the motion of the bonding tool.

The bonding tool of a conventional bonding machine during the ball bond wedge bond cycle follows a pattern of motion along the vertical axis or Z axis driven by the Z-motion velocity curve, trace or waveform signal 40 as shown in the timing diagram in FIG. 5. The Z-motion velocity waveform signal 40 drives the servo motor or Z-motor in turn coupled through the eccentric 16, connecting rod 17, and tool lifter 14 to the tool holder 12 as shown in FIG. 1 so that the bonding tool 10 follows the desired pattern of motion along the vertical or Z axis. The actual change of position or displacement of the bonding tool during a complete ball bond wedge bond cycle is depicted by the Z-motion displacement curve 50 shown in FIG. 5 above the Z-motion velocity waveform 40. A number of additional timing traces are shown correlated with the Z-motion velocity waveform and Z-motion displacement curve during a ball bond wedge bond cycle including the contact timing diagram or time line 42. This two level time chart 42 indicates the portion of a ball bond wedge bond cycle during which the contacts 20 between the tool lifter 14 and tool holder 12 of FIG. 1 are closed and when they are open. The contacts 20 are closed during the low level portions of the cycle and open during the high level portions of the cycle.

Figure 5A:
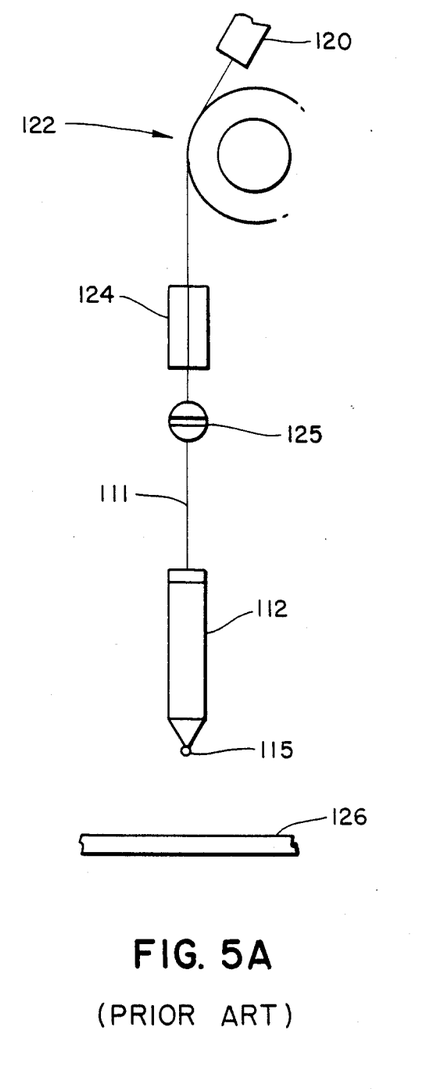
FIG. 5A is a simpled schematic diagram of the elements of the prior art bonding head and bonding tool whose operations are summarized in the timing diagram of FIG. 5.

The remaining timing traces of FIG. 5 apply to components or elements of the bonding machine shown diagrammatically in FIG. 5A. FIG. 5A shows a bonding tool 112 with a lead wire 111 passing through the capillary channel of bonding tool 112 and terminating in a bonding ball 115 ready for ball bonding to the die pad of an integrated circuit chip. The lead wire 111 is fed from a spool not shown in the bonding machine through the light constant friction drag 120, capstain 122, loop control wire tensioning device or wire tensioner 124 and wire clamp 125 before passing through the bonding tool 112. The bonding tool 112 is positioned by the bonding head of the bonding machine over a work holder 126 on which is mounted a strip of lead frames for bonding the lead wires between integrated circuit chips bonded to the lead frames and the lead frame fingers.

The wire tensioner 124 and wire clamp 125 are actuated by solenoids respectively. The wire tensioner 124 is closed and opened by the tensioner solenoid according to the timing signal 44 of FIG. 5. The wire tensioner 124 is closed on the lead wire 111 during the low level portions of timing signal 44 while the wire tensioner 124 is open during the high level portions of timing signal 44. The wire clamp 125 is opened and closed by the wire clamp solenoid according to the timing signal 45 of FIG. 5. The clamp is closed on the wire during the ball bond wedge bond cycle at the low level portions of timing signal 45 and is open during the high level portions of timing signal 45.

The timing diagram of FIG. 5 also includes a timing signal 46 for the damper solenoid, not shown, coupled between the tool lifter and tool holder for locking or holding the tool lifter and tool holder in position relative to each other during high acceleration of the bonding tool to prevent the electrical contacts 20 of FIG. 1 from opening. The damper solenoid is actuated to lock the tool lifter and tool holder in fixed relationship relative to each other during the ball bond wedge bond cycle at the high level portions of signal 46 and is deactuated to permit relative motion between the tool lifter and tool holder during the low level portions of timing signal 46. Also shown in FIG. 5 is the timing signal 48 for the electronic flame-off (EFO) solenoid which actuates the EFO shield or electrode to swing out beneath the capillary tool for electric discharge between the lead wire and shield to form a ball at the end of the lead wire for the next ball bond wedge bond cycle, all as described, for example, in U.S. Pat. No. 4,390,771.

Figure 5B:
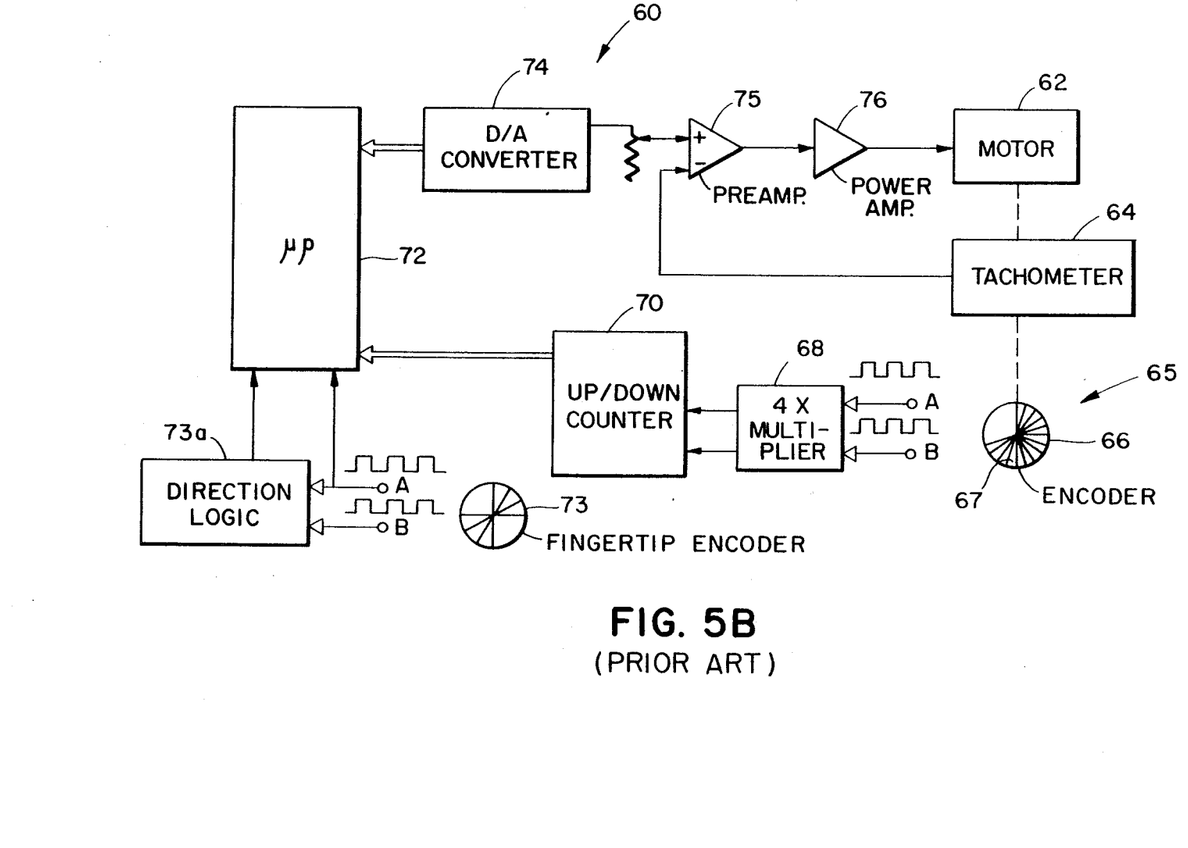
FIG. 5B is a block diagram of the servo motor control loop including the microprocessor of the bonding machine and the digital to analog converter.
Figure 6:
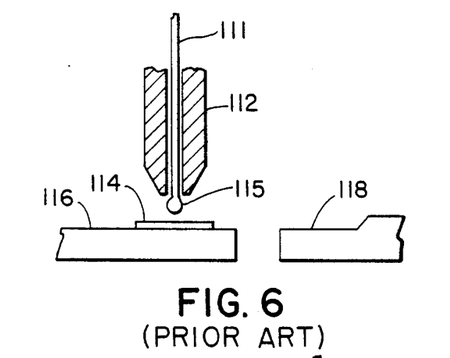
FIGS. 6, 7, 8, 9 and 10 are diagrammatic views of the capillary bonding tool during successive steps in the ball bond wedge bond cycle.

The servo motor or Z-motor control loop 60 which generates the Z-motion velocity waveform signal is illustrated in FIG. 5B. The Z-motor is a DC servo motor 62 with a tachometer 64 and position encoder 65 consisting of photo sensor not shown and a disk 66 with radial lines 67. The DC servo motor 62 turns the eccentric 16 of FIG. 1 and drives the bonding tool in the desired pattern of motion as heretofore described. As the position encoder disk 66 rotates a photosensor senses the radial lines and delivers two binary signals A and B through a repeating pattern of four combinations to the multiplier 68 which is a X4 multiplier. The X4 multiplier 68 and up down counter 70 resolve the combinations into individual counts for input to the bonding machine microprocessor 72.

The computer 72 compares the actual position of the bonding tool with a desired position curve, namely the Z-motion displacement curve 50 of FIG. 5. The desired position changes constantly as the microprocessor 72 drives the various moving elements during the ball bond wedge bond cycle and the digital signal representing the difference between the actual position and desired position is appropriately processed and input to the digital to analog converter 74. The analog voltage output of D/A converter 74 is adjusted and the tachometer voltage from tachometer 64 is subtracted from it. The difference passes through preamplifier 75 and power amplifier 76 to provide the Z-motion velocity wave form drive signal to servo motor 62. The Z-motor or servo motor 62 is thus driven to a velocity proportional to the error or difference between the actual position of the bonding tool and the desired position. For larger differences the motor runs toward the desired position at high speed. As the difference or error decreases, the motor operates at low velocity. A fingertip encoder 73 with direction logic 73a is also provided for manually positioning the bonding head and bonding tool.

The bonding tool computer or microprocessor 72 controls the motion of the work holder 126 in the horizontal plane along the horizontal X-Y axes or coordinate system while at the same time controlling the motion of the bond head and bonding tool along the vertical or Z axis as heretofore described. Through additional timing signals, some of which are shown diagrammatically in FIG. 5, the microprocessor 72 also controls the timing and operation of the wire tensioner 124, wire clamp 125, timing of the bonding ball formation or EFO, and in addition, operation of the ultrasonic generator for delivering ultrasonic bonding energy to the bonding tool.

Referring to FIG. 5, at the beginning of a ball bond wedge bond cycle the Z-motor or servo motor 62 drives the tool lifter and tool holder down while the damper solenoid maintains the tool holder and tool lifter in constant relationship and prevents the contacts 20 from opening during the high acceleration portion of the Z-motion displacement of the bonding tool. The high acceleration portions of the Z-motion displacement curve and Z-motion velocity waveform during initial downward motion are designated generally by the reference numeral 51. The high acceleration motion stops a few mils above the ball bond location at a die pad of an integrated circuit chip mounted on a lead frame in turn supported on the work holder. The damper solenoid is turned off and the motion of the bonding tool changes from controlled high acceleration to a constant low velocity approach generally indicated by numeral 52 on the Z-motion displacement curve 50 and Z-motion velocity waveform 40. During these initial phases of motion the electrical contacts 20 are closed, the wire clamp 125 is open for feeding of lead wire, and wire tension is maintained by the wire tensioner or tensioner drag 124.

The bonding tool continues downward at a constant low velocity until the bonding tool contacts the work piece, in this case the die pad of an integrated circuit chip. The contacts 20 open as the tool lifter continues to be driven down a predetermined distance of over travel deflecting the bond force spring 15 shown in FIG. 1 for exerting the first bond force. The opening of contacts 20 signals the microprocessor 72 to turn on the ultrasonic generator and apply ultrasonic energy to the bonding tool for a preselected duration. As heretofore described, according to this conventional method, ultrasonic energy is applied to the bonding tool only after contact and substantial bond force has been applied so that effective welding is restricted to a peripheral or circumferential area at the ball bonding site.

The portion of the Z-motion displacement curve 50 and Z-motion velocity waveform 40 representing the duration of contact of the bonding tool at the die pad for ball bonding is designated generally by numeral 53. During the period of contact by the bonding tool during ball bonding the electrical contacts 20 remain open and the damper solenoid is turned off. At the end of the ball bond time, the Z-motor or servo motor 62 reverses and pulls the tool lifter upward. The tool lifter contacts the tool holder and pulls the tool holder and bonding tool upward at high acceleration indicated by portions of the Z-motion displacement curve and Z-motion velocity waveform designated generally by reference numeral 54. The wire clamp 125 of course remains open. During the high acceleration motion upward to the loop position 54a, the work holder or work table 126 moves a preselected horizontal distance in the X-Y coordinate axis plane for positioning the second bonding site or wedge bond site in the form of a lead frame finger below the bonding tool.

After reaching the loop height 54a the bonding tool is driven downward at high acceleration toward the second bond site or wedge bond position indicated by reference numerals 55 on the Z-motion displacement curve 50 and Z-motion velocity waveform 40 and a few mils above the wedge bond location at the lead frame finger the motion of the bonding tool changes to a constant low velocity indicated generally by the reference numerals 56. The bonding tool continues to be driven downward with constant low velocity until it strikes the lead frame finger or second bond surface and the tool lifter continues downward deflecting the bond force spring 15 for applying the second bond force at the wedge bond site. The wedge bonding portion of the ball bond wedge bond cycle is designated generally by reference numerals 57 on the Z-motion displacement curve 50 and Z-motion velocity waveform 40 of FIG. 5. During the wedge bonding portion of the cycle the electrical contacts 20 are of course open and ultrasonic energy is applied to the bonding tool under control of microprocessor 72 but only after contact is made by the bonding tool against the lead frame finger. As a result the co-mingling weld is limited to a peripheral or circumferential region around the area of surface contact.

At the end of the second bond period or wedge bond time the Z-motor or servo motor 62 reverses and pulls the tool lifter upward, again engaging the tool holder and pulling the bonding tool away from the wedge bond and lead frame finger surface. During the initial rise of the bonding tool the wire clamp remains open and the bonding tool slides upward along the lead wire with the lead wire passing down the capillary channel through the bonding tool. At a pre-programmed height the wire clamp 125 is closed by the wire clamp solenoid as indicated by the wire clamp timing signal 45 of FIG. 5. With the damper solenoid already actuated the tool lifter, tool holder, and bonding tool are driven further upward tearing the bonding wire adjacent to the wedge bond or second bond leaving a wire tail of pre-programmed length protruding below the capillary bonding tool for formation of another bonding ball prior to initiation of the next ball bond wedge bond cycle.

The bonding tool is raised to its full height through the portion of the Z-motion displacement curve and Z-motion velocity waveform generally designated by reference numeral 58 at which height the EFO solenoid causes the EFO shield or electrode to swing out under the bonding tool for arc discharge between the lead wire and shield to form a bonding ball at the end of the lead wire as described, for example, in U.S. Pat. No. 4,390,771. The computer then directs movement of the work holder table in the X-Y coordinate axis plane to position the next ball bond location, being the die pad of an integrated circuit chip, below the bonding tool in preparation for the next ball bond wedge bond cycle.

Figure 7:
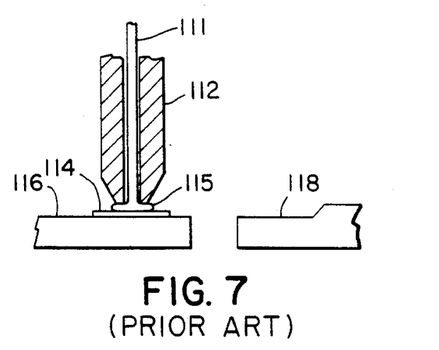
Figure 8:
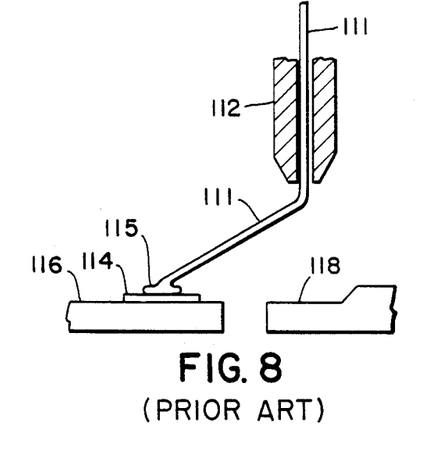
Figure 9:
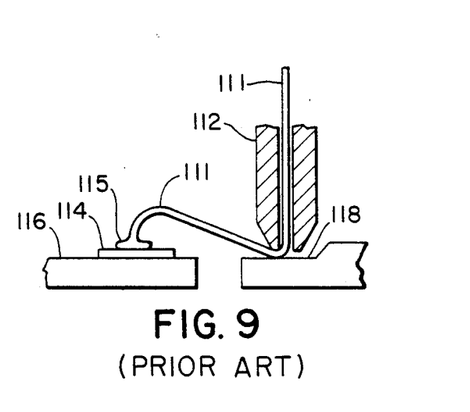
Figure 10:
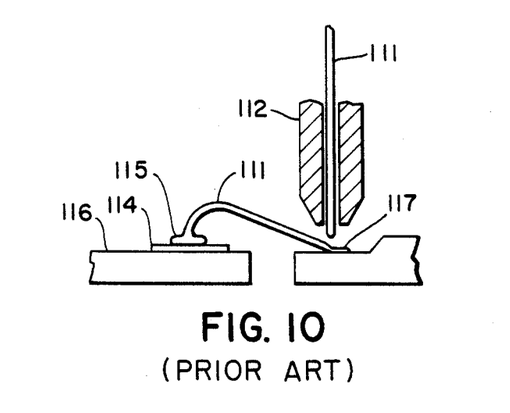

The ball bond wedge bond cycle characterized above with reference to the Z-motion velocity waveform signal and Z-motion displacement curve may be further visualized with reference to the sequence of illustrations in FIGS. 6 thru 10. The ball 115 of lead wire metal at the end of lead wire 111 held in the capillary bonding tool 112 is positioned over the die pad 114 of integrated circuit chip 116 in FIG. 6. Following the motion along the vertical axis according to the Z-motion velocity waveform, the lead wire is ball bonded to the die pad as illustrated in FIG. 7. The bonding tool 12 rises to the loop height while the work holder translates in the horizontal X-Y plane for positioning the bonding tool 112 over a lead frame finger 118 while leaving sufficient length of lead wire 111 to form the bonded lead between the die pad 114 and lead frame finger 118. After wedge bonding the lead wire 111 to the lead frame finger 118, as shown in FIG. 9, the bonding tool 112 rises to a pre-programmed height at which the wire clamp is actuated for severing the lead wire 111 above the wedge bond 117 upon further upward movement of the bonding head and bonding tool as illustrated in FIG. 10.

Figure 11:
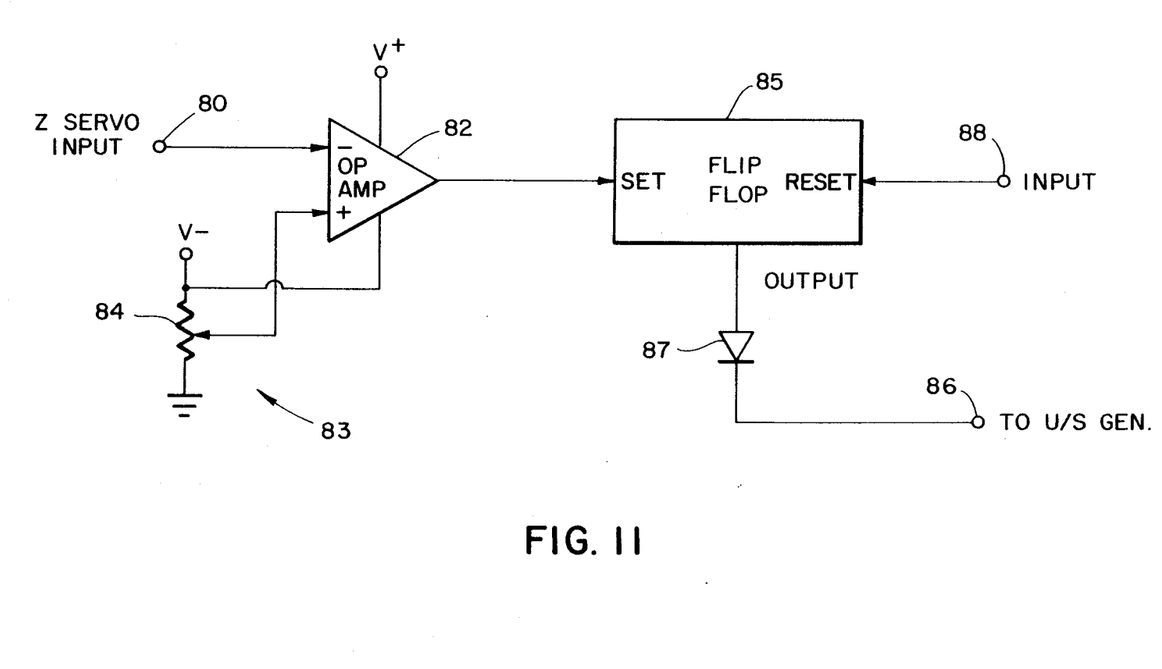
FIG. 11 is a schematic diagram of the bonding tool position sensor and gate according to the invention for coupling to the logic control, servo control and ultrasonic generator of the ball bonding machine.

In the improvement according to the present invention illustrated in FIG. 11, the Z-motion velocity waveform 40 previously described with reference to FIG. 5 is tapped from the input 80 to the servo motor or Z servo motor 62 previously described with reference to FIG. 5B. The direction of change or polarity and the amplitude of the Z-motion velocity waveform signal at input 80 is sensed by operational amplifier or op amp 82 which is provided with a threshold adjustment 83 including the variable resistance 84 in a feedback loop for varying and adjusting the threshold signal level of the Z-motion waveform signal to be sensed and detected. An example of a threshold adjustment for detecting a desired threshold level of the Z-motion velocity waveform input to the Z servo motor is illustrated at the top of the timing diagram of FIG. 12B. A segment 90 of the Z-motion velocity waveform signal 40 previously described with reference to FIG. 5 is there shown with a selected threshold level to be sensed by op amp 82 indicated by dotted line 92. The threshold level is set for detection at a polarity during downward motion of the bonding tool commencing at a value 93 on the Z-motion velocity waveform curve corresponding to a position of the bonding tool above the lead frame finger prior to contact. The rising edge 94 of the corresponding pulse at the op amp output 95 sets the flip flop 85 so that flip flop 85 delivers a high level signal at the output 86 through diode 87 to actuate the ultrasonic generator for delivery of ultrasonic bonding energy to the bonding tool prior to contact with the lead frame finger or other bonding substrate. As shown in FIG. 12B, the flip flop output trace 96 remains at a high level 97 until it is reset by a bond timer pulse 98 at the reset input 88 of flip flop 85. The bond timer signal represented by pulse 98 of FIG. 12B is derived from the microprocessor 72 or other bond timer signal conventionally available in the bonding machine for turning off the ultrasonic generator.

Thus, according to the present invention, the ultrasonic bonding energy is applied to the bonding tool at a location just above a particular bonding site and prior to contact in order to increase the bonding surface area to substantially the entire area of surface contact between the lead wire and substrate. The application of ultrasonic bonding energy continues during the period of the high level output pulse 97 from flip flop 85 which actuates the ultrasonic generator until the flip flop 85 is reset by the falling edge of the bond timing pulse 98 as preprogrammed and determined by the microprocessor 72 or ultrasonic generator itself.

Figure 12:
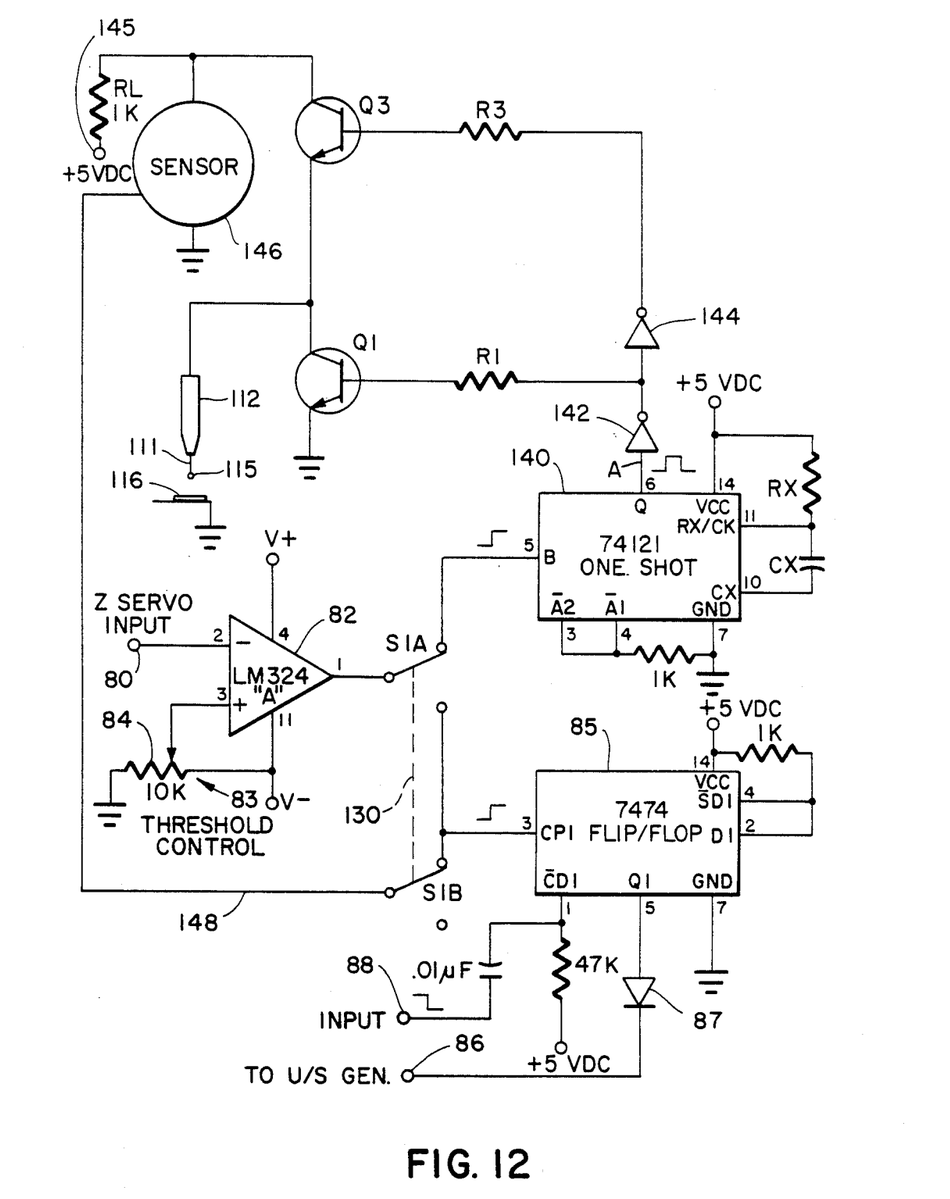
FIG. 12 is a schematic diagram of a circuit including alternative embodiments according to the invention first to initiate ultrasonic bonding energy prior to contact of the bonding tool by sensing the bonding tool position from the Z-motion velocity waveform and alternatively for initiating ultrasonic bonding energy upon contact of the bonding tool by electrically sensing contact of the bonding tool at a substrate.

A more elaborate circuit for implementing the present invention according to alternative embodiments is illustrated in FIG. 12. For switching between the alternative embodiments of the invention illustrated in FIG. 12 a two ganged switch 130 is provided with separate gang switches S1A and S1B. With the two gang switch 130 in the lower position opposite that illustrated in FIG. 12 the circuit operates in the same manner heretofore described with reference to FIG. 11 with the same reference numerals indicated and in accordance with the timing diagram of FIG. 12B. In this example flip flop 85 comprises, for example, a 7474 IC flip flop with the terminals and pin numbers coupled as indicated while op amp 82 comprises, for example, an LM324 IC with terminal pin numbers coupled as shown.

With two gang switch 130 in the upper position as illustrated in FIG. 12 the the present invention is implemented according to an alternative embodiment in which the ultrasonic generator is actuated substantially upon contact of the bonding tool with a bonding substrate by electronically sensing contact by the bonding tool with the bonding substrate. This electrical or electronic sensing circuit for sensing electrical contact is of the type described, for example in FIG. 9 of the above referenced U.S. Pat. No. 4,555,052. The one shot multivibrator 140 which may be, for example a 74121 IC with terminals and pin numbers coupled as shown delivers a signal of alternatively high level or low level value through inverters 142 and 144 through resistors R1 and R3 respectively to transistor switches Q1 and Q3 so that when one of the transistors Q1 or Q3 is conducting, the other is non-conducting. Q1 is conducting during a small portion of the ball bond wedge bond cycle for ball formation of a ball 115 at the end of lead wire 111 held in the bonding tool 112. Thus, when Q1 is conducting the lead wire 111 is grounded for establishing an arc between the EFO shield or electrode and the lead wire 111 for melting and forming the ball 115 as described, for example, in U.S. Pat. No. 4,390,771. When Q1 is conducting, Q3 is not conducting.

During most of the ball bond wedge cycle, however, the transistor Q3 is conducting placing the circuit of FIG. 12 in the sensing mode for sensing contact by the bonding tool 112 and lead wire 111 with a bonding surface or substrate 116. With Q3 conducting and Q1 non-conducting, a voltage source 145 is applied through resistance RL which may be, for example, a 1K resistor to the lead wire 111 for conducting a current to ground through the bonding substrate 16 upon contact. Current sensor 146 senses current passing through the lead wire 111 and in turn delivers an actuating signal over line 148 for setting the flip flop 85 actuating the ultrasonic generator as heretofore described.

Figure 12A:
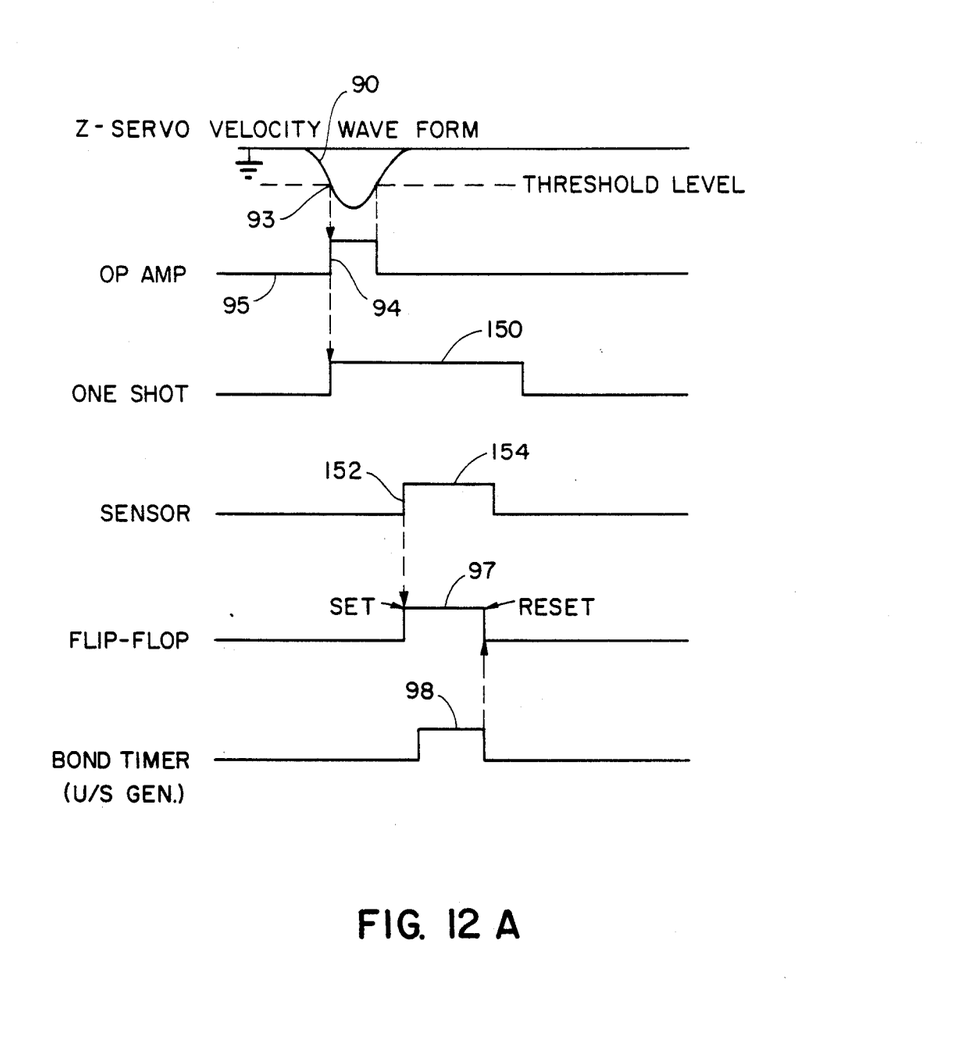
Figure 12B:
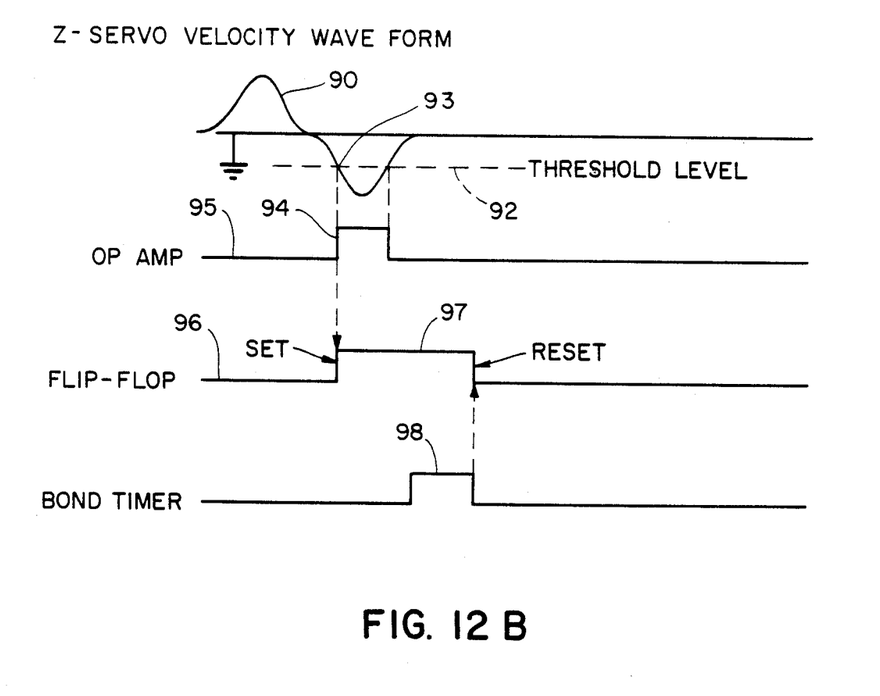
FIG. 12B is a timing diagram for the alternative embodiment of the circuit of FIG. 12.

Referring to FIGS. 12 and 12A, the duration of the high level pulse 150 at the output of one shot multivibrator 140 which drives and maintains the transistor Q3 in the conducting state is controlled by the values of resistor RX and capacitor CX. These values are selected to maintain the duration of the sensing mode for substantially the entire ball bond wedge bond cycle excluding the period of ball formation or electronic flame-off at the beginning of each cycle. The rising edge 152 of the output pulse 154 from sensor 146 upon sensing current passing through lead wire 111 sets the flip flop 85 which delivers the high level pulse 97 for actuating the ultrasonic generator as heretofore described for a duration until the flip flop is reset by the falling edge of bond timing signal pulse 98 derived from the bonding machine microprocessor or other bond timing circuitry as heretofore described.

While the embodiments of the present invention illustrated in FIGS. 11 and 12 sense the position of the bonding head and bonding tool according to the threshold level of the Z-motion velocity waveform signal, the position information for the bonding head and bonding tool may also be derived directly from the digital position information generated by the microprocessor 72 of FIG. 5B. Thus, the invention also contemplates sensing the position of the bonding head and bonding tool by sampling the digital position information provided by the microprocessor 72 to the digital to analog converter 74 for the purpose of initiating turn-on of the ultrasonic generator prior to contact. According to the alternative embodiment of the invention for turn-on of the ultrasonic generator upon electrically sensing contact of the bonding tool with a bonding substrate, the invention also contemplates a variety of other electrical sensing circuits for sensing electrical contact, for example, of the type illustrated in FIGS. 8, 9, and 11 of U.S. Pat. No. 4,555,052 referenced above.

Thus, while the invention has been described with reference to particular example embodiments, it is intended to cover all variations and equivalents within the scope of the following claims.

We claim:

1. An improved lead wire ball bonding machine having a movable bonding head and capillary bonding tool for ball bonding the end of a lead wire held in the bonding tool to a die pad of an integrated circuit chip and for wedge bonding a segment of the lead wire spaced from the ball bond to a lead frame finger during successive ball bond wedge bond cycles, an ultrasonic generator for application of ultrasonic bonding energy to the bonding tool, bond force means for applying specified bonding tool force at the ball bond and then wedge bond, logic control means for generating digital control signals initiating and timing the steps in the ball bond wedge bond cycle, and servo control means generating a Z-motion analog velocity waveform for controlling motion of the bonding head and bonding tool throughout the ball bond wedge bond cycle, wherein the improvement comprises:

bonding tool position sensing means, said position sensing means constructed and arranged for generating a first output signal corresponding to a first location of the bonding head and bonding tool during motion downward toward the die pad of an integrated circuit chip prior to contact by the bonding tool for ball bonding, and a second output signal corresponding to a second location of the bonding head and bonding tool during motion downward toward a lead frame finger prior to contact of the bonding tool for wedge bonding;

said bonding tool position sensing means comprising a Z-motion analog velocity waveform signal sensor coupled to receive the Z-motion velocity waveform signal and detect the signal level and direction of change of the Z-motion velocity waveform signal for determining the location of the bonding head and bonding tool according to the signal level and direction of change of the Z-motion waveform signal;

and coupling means for coupling said first and second output signals to the ultrasonic generator of the ball bonding machine for application of ultrasonic energy to the bonding tool prior to contact of the bonding tool for ball bonding and wedge bonding respectively thereby initiating welding and bonding upon contact and optimizing the bonding surface area.

2. The apparatus of claim 1 wherein said bonding machine logic control means generates digital control signals turning off the ultrasonic generator a predetermined period of time after application of a specified bonding tool force for turning off the ultrasonic generator and for setting of the bonding surface area prior to motion of the bonding tool.

3. The apparatus of claim 1 wherein said bonding tool position sensing means comprises an operational amplifier having one of its inputs coupled to the Z-motion velocity waveform signal and further comprising threshold adjustment means coupled to the operational amplifier for varying the threshold level at which the Z-motion velocity waveform signal is detected for generating the first and second output signals from the operational amplifier.

4. The apparatus of claim 3 wherein said coupling means comprises gating means having a first input coupled to the output of said operational amplifier means, said gating means also having a second input coupled to receive digital logic control signals from the logic control means of the bonding machine for indicating the start of a ball bond wedge bond cycle, said gating means having an output coupled to the ultrasonic generator for turning on said generator to apply ultrasonic bonding energy to the bonding tool prior to contact of the bonding tool for ball bonding and wedge bonding.

5. The apparatus of claim 4 wherein said gating means comprises a flip flop, wherein the output of the operational amplifier is coupled to the set input of the flip flop, wherein the reset input of the flip flop is coupled to receive said digital logic control signals from the bonding machine logic control means, and wherein the output of the flip flop is coupled through diode means to the ultrasonic generator of the bonding machine.

6. An improved lead wire ball bonding machine having a movable bonding head and capillary bonding tool for ball bonding the end of a lead wire held in the bonding tool to a die pad of an integrated circuit chip and for wedge bonding a segment of the lead wire spaced from the ball bond to a lead frame finger during successive ball bond wedge bond cycles, an ultrasonic generator for application of ultrasonic bonding energy to the bonding tool, bond force means for applying specified bonding tool force at the ball bond and then the wedge bond, logic control means for generating digital control signals initiating and timing the steps in the ball bond wedge bond cycle, and servo control means generating a Z-motion analog velocity waveform for controlling motion of the bonding head and bonding tool throughout the ball bond wedge bond cycle, wherein the improvement comprises:

operational amplifier means having an input coupled to receive the Z-motion analog velocity waveform signal for detecting the location of the bonding head and bonding tool according to the signal level and direction of change of the sensed Z-motion analog velocity waveform signal, said operational amplifier means comprising variable threshold adjustment means for adjusting the threshold signal detection level of the Z-motion analog velocity waveform signal, said operational amplifier and threshold adjustment means constructed and arranged for generating a first ultrasonic generator actuating signal during motion of the bonding tool in a downward direction toward the die pad of an integrated circuit chip prior to contact of the bonding tool for ball bonding, and for generating a second ultrasonic generator control signal during motion of the bonding tool in a downward direction toward a lead frame finger prior to contact of the bonding tool for wedge bonding;

and gating means comprising a flip flop having a first set input operatively coupled to the output of said operational amplifier, said gating means flip flop having a second reset input operatively coupled to receive digital logic control signals from the logic control means of the bonding machine for indicating start of a ball bond wedge bond cycle, said gating means flip flop having an output coupled to the ultrasonic generator for turning on said generator to apply ultrasonic bonding energy to the bonding tool prior to contact of the bonding tool for ball bonding and wedge bonding thereby initiating welding and bonding upon contact and optimizing the bonding surface area of the ball bond and wedge bond;

said bonding machine logic control means generating digital control signals for turning off the ultrasonic generator a specified period of time after application of specified bonding tool force at the ball bond and at the wedge bond for turning off the ultrasonic generator prior to motion in a vertical direction upward by the bonding tool away from the ball bond and wedge bond for joining of the weld surface area at the ball bond and wedge bond prior to motion of the bonding tool.

7. An improved lead wire ball bonding machine having a movable bonding head and capillary bonding tool for ball bonding the end of a lead wire held in the bonding tool to a die pad of an integrated circuit chip and for wedge bonding a segment of the lead wire spaced from the ball bond to a lead frame finger during successive ball bond wedge bond cycles, an ultrasonic generator for application of ultrasonic bonding energy to the bonding tool, bond force means for applying specified bonding tool force at the ball bond and then the wedge bond, logic control means for generating digital control signals initiating and timing the steps in the ball bond wedge bond cycle, and servo control means generating a Z-motion analog velocity waveform for controlling motion of the bonding head and bonding tool throughout the ball bond wedge bond cycle, wherein the improvement comprises:

electrical circuit means for electrically sensing initial contact of the bonding tool and lead wire with the die pad of an integrated circuit chip during ball bonding, said electrical circuit means providing an actuating signal upon electrically sensing initial contact;

and coupling means for coupling said actuating signal to the ultrasonic generator for actuating and turning on said ultrasonic generator and applying ultrasonic bonding energy to the bonding tool substantially upon said electrically sensed initial contact.

8. The apparatus of claim 7 wherein said electrical circuit means comprises:

first circuit means including a voltage source, resistance, and first electronic switch coupled in series with the lead wire and chip for passing current through the lead wire and chip to ground upon contact of the bonding tool with the die pad when the first electronic switch is conducting:

second circuit means including a ground potential coupling and second electronic switch coupled in series with the lead wire for coupling the lead wire to ground potential when the second electronic switch is conducting;

gate means for controlling the first and second electronic switches in opposite conducting states, said gate means coupled to the logic control means of the bonding machine so that the first electronic switch is conducting and the second electronic switch is nonconducting during the ball bonding step of the ball bond wedge bond cycle;

and sensor means coupled to the first circuit means for sensing current in the first circuit means when the first electronic switch is conducting and for generating said actuating signal thereby indicating initial contact of the bonding tool and lead wire for ball bonding.

9. The apparatus of claim 8 wherein said bonding machine comprises bond force detection means and timing means for timing the application of ultrasonic energy to the bonding tool upon detection of a specified bond force, said logic control means of the bonding machine automatically turning off the ultrasonic generator after lapse of the specified period of time and prior to motion of the bonding tool upward from the ball bonding location.

10. An improved method for ball bonding the end of a lead wire held in the capillary bonding tool of a ball bonding machine to a die pad of an integrated circuit chip and for wedge bonding a segment of the lead wire spaced from the ball bond to a lead frame during successive ball bond wedge bond cycles, said method including the prior art steps of generating ultrasonic bonding energy and applying the ultrasonic bonding energy to the bonding tool for ball bonding and wedge bonding, applying a first bond force to the bonding tool during ball bonding, applying a second bond force to the bonding tool during wedge bonding, generating digital logic control signals for initiating and timing the steps of the ball bond wedge bond cycle, and generating a Z-motion analog velocity waveform for controlling motion of the bonding tool throughout the ball bond wedge bond cycle, wherein the improvements in the method comprise:

sensing the position and motion of the bonding tool during the ball bond wedge bond cycle by sensing the Z-motion velocity waveform signal, detecting the Z-motion velocity waveform signal level and direction of change, and determining the location of the bonding tool according to the Z-motion velocity waveform signal level and direction of change;

generating a first output signal corresponding to a first location of the bonding tool during motion of the bonding tool downward toward the die pad of an integrated circuit chip prior to contact by the bonding tool for ball bonding;

applying ultrasonic bonding energy to the bonding tool in response to the first output signal prior to contact of the bonding tool for ball bonding whereby bonding is initiated upon contact thereby increasing the bonding surface area;

generating a second output signal corresponding to a second location of the bonding tool during motion of the bonding tool downward toward a lead frame finger prior to contact of the bonding tool for wedge bonding;

applying ultrasonic bonding energy to the bonding tool prior to contact of the bonding tool for wedge bonding whereby bonding is initiated upon contact thereby increasing the bonding surface area.

11. The method of claim 10 further comprising the steps of:

timing the application of ultrasonic bonding energy to the bonding tool;

terminating application of ultrasonic bonding energy to the bonding tool while the bonding tool is in contact for either ball bonding or wedge bonding;

and raising the bonding tool after the bonding surface area is set.

12. The method of claim 10 wherein the step of sensing the position and motion of the bonding tool comprises sensing the digital control signals generated for initiating and timing the steps in the ball bond wedge bond cycle, detecting the digital control signals which initiate motion of the bonding tool for the ball bond step and wedge bond step respectively, and determining the position and motion of the bonding tool according to said digital control signals.

13. An improved method for ball bonding the end of a lead wire held in the capillary bonding tool of a ball bonding machine to a die pad of an integrated circuit chip and for wedge bonding a segment of the lead wire spaced from the ball bond to a lead frame during successive ball bond wedge bond cycles, said method including the prior art steps of generating ultrasonic bonding energy and applying the ultrasonic bonding energy to the bonding tool for ball bonding and wedge bonding, applying a first bond force to the bonding tool during ball bonding, applying a second bond force to the bonding tool during wedge bonding, generating digital logic control signals for initiating and timing the steps of the ball bond wedge bond cycle, and generating a Z-motion analog velocity waveform for controlling motion of the bonding tool throughout the ball bond/wedge bond cycle, wherein the improvements in the method comprise:

electrically sensing initial contact of the bonding tool and lead wire with the die pad of an integrated circuit chip for ball bonding:

generating a bonding energy control signal in response to said electrically sensed initial contact;

and applying ultrasonic bonding energy to the bonding tool in response to said bonding energy control signal whereby ultrasonic bonding energy is applied to the bonding tool substantially upon initial contact for optimizing the bonding surface area of the ball bond.

14. The method of claim 13 comprising the further steps of:

timing the application of ultrasonic bonding energy to the bonding tool;

terminating application of ultrasonic bonding energy while the bonding tool is in contact for ball bonding;

and raising the bonding tool after setting of the ball bond surface area.

15. The method of claim 13 wherein the step of sensing initial contact of the bonding tool and lead wire for ball bonding comprises coupling the lead wire in a sensing circuit, applying a voltage to the lead wire, and sensing passage of current through circuit including the lead wire.

* * * * *